US008188788B2

(12) United States Patent  (10) Patent No.: US 8,188,788 B2
Lee  (45) Date of Patent: May 29, 2012

(54) SYSTEMS AND METHODS FOR A DISCRETE RESIZING OF POWER DEVICES WITH CONCURRENT POWER COMBINING STRUCTURE FOR RADIO FREQUENCY POWER AMPLIFIER

(75) Inventor: Chang-Ho Lee, Marietta, GA (US)

(73) Assignee: Samsung Electro-Mechanics, Gyunngi-Do (KR)

(*) Notice: Subject to any disclaimer, the term of this patent is extended or adjusted under 35 U.S.C. 154(b) by 123 days.

(21) Appl. No.: 12/765,988

(22) Filed: Apr. 23, 2010

(65) Prior Publication Data

US 2011/0260797 A1   Oct. 27, 2011

(51) Int. Cl.
 H03F 1/14 (2006.01)
 H03F 3/68 (2006.01)
(52) U.S. Cl. .................. 330/51; 330/195; 330/295
(58) Field of Classification Search .......... 330/51, 330/124 R, 195, 295
See application file for complete search history.

(56) References Cited

U.S. PATENT DOCUMENTS 6,937,096 B2   8/2005 Wight et al.
7,135,919 B2 * 11/2006 Chen ......................... 330/51
7,589,588 B2 *  9/2009 Ohnishi et al. ............ 330/51

OTHER PUBLICATIONS

Gang Liu et al., "A 1.2V, 2.4GHz Fully Integrated Linear CMOS Power Amplifier with Efficiency Enhancement." IEEE 2006 Custom Integrated Circuits Conference (CICC), p. 141-144.
Kyu Hwan An et al., "A 2.4GHz Fully Integrated Linear CMOS Power Amplifier with Discrete Power Control." IEEE Microwave and Wireless Components Letters, vol. 19, No. 7, Jul. 1999, p. 479-481.
P. Reynaert and M. Steyaert, "A 2.45-GHz 0.13-μm CMOS PA with Parallel Amplification," IEEE J. Solid-State Circuits, vol. 42, No. 3, Mar. 2007, p. 551-562.
Peter Haldi et al., "A 5.8 GHz 1 V Linear Power Amplifier Using a Novel On-Chip Transformer Power Combiner in Standard 90 nm CMOS." IEEE Journal of Solid-State Circuits, vol. 43, No. 5, May 2008, p. 1054-1063.
Peter Haldi et al., "A 5.8 GHz Linear Power Amplifier in a Standard 90nm CMOS Process using a 1 V Power Supply." IEEE Radio Frequency Integrated Circuits Symposium, p. 431-434.
Debopriyo Chowdhury et al., "A Fully Integrated Dual-Mode Highly Linear 2.4 GHz CMOS Power Amplifier for 4G WiMax Applications." IEEE Journal of Solid-State Circuits, vol. 44, No. 12, Dec. 2009.
Gang Liu et al., "Fully Integrated CMOS Power Amplifier with Efficiency Enhancement at Power Back-Off." IEEE Journal of Solid-State Circuits, vol. 43, No. 3, Mar. 2008.
Kyu Hwan An et al., "Power-Combining Transformer Techniques for Fully-Integrated CMOS Power Amplifiers." IEEE Journal of Solid-State Circuits, vol. 43, No. 5, May 2008, p. 1064-1075.

* cited by examiner

Primary Examiner — Steven J Mottola

(57) ABSTRACT

Systems and methods are provided for discrete resizing of power devices. The systems and methods can include a plurality of unit power amplifiers arranged in parallel, where each unit power amplifier includes at least one first input port, at least one first output port, and a plurality of sub-power-device cells configured in parallel between the at least one first input port and the at least one first output port; a switch controller, where the controller is operative to activate or deactivate at least one of the plurality of sub-power-device cells of a respective unit power amplifier; and an output matching network, where the matching network is configured to combine respective outputs from the respective plurality of unit power amplifiers to generate a system output, wherein during an operational state, all of the plurality of unit power amplifiers contribute outputs to the matching network to generate the system output.

19 Claims, 8 Drawing Sheets

SYSTEMS AND METHODS FOR A DISCRETE RESIZING OF POWER DEVICES WITH CONCURRENT POWER COMBINING STRUCTURE FOR RADIO FREQUENCY POWER AMPLIFIER

FIELD OF THE INVENTION

The invention relates generally to discrete resizing of power devices with parallel power combining structure for complementary metal-oxide-semiconductor (CMOS) radio frequency (RF) power amplifiers.

BACKGROUND OF THE INVENTION

In implementing fully integrated wireless transmitter systems, CMOS RF power amplifiers have been an important component block to handle RF signals carrying modulated data. To support high data-rate wireless transmission, the power amplifiers should be able to deliver very high output power to antennas while maintaining good power efficiency. Most importantly, the linearity of the power amplifiers must be good enough not to distort modulated data signals.

A power combining technique is a good means to generate high output power out of moderate output powers of individual power amplifiers. Because the required output power level for individual amplifiers can be lowered as the number of combined amplifiers increases, individual amplifiers can have more linearity margins. If the RF signal swing at the input node of transistor in the output power stage can be kept low, there will be less signal distortions by non-linear function of saturated output transistors. Discrete power controllability of multi-combined power amplifier is another advantage in terms of enhancing the power efficiency. In typical power amplifiers, overall efficiency, which is the ratio of transferred output power to DC power dissipation, drops radically as the output power level is lowered. If the number of functioning PAs is reduced by disabling part of active amplifying paths as the required output power level is lowered, overall power efficiency can be enhanced by saving DC power dissipation of the inactive PAs.

Conventional power combining techniques use multiple power transferring paths that are combined by output matching networks such as transformers. For discrete control of PA systems to improve efficiency at power back-offs, those conventional structures activate or inactivate individual power transferring paths by turning-off unnecessary PAs, so that inactive PAs are not contributing to the power combining at the output matching network (transformer in typical case). Because negative effects of idle PAs on output matching networks are negated in the conventional structures, the maximum available efficiency of the output matching networks cannot be acquired.

BRIEF SUMMARY OF INVENTION

According to an example embodiment of the invention, there may be a power amplifier system. The power amplifier system may include a plurality of unit power amplifiers in which their respective outputs are combined by a matching network. The output matching network may include variable or tunable parallel capacitors/capacitive elements and an inductively coupled transformer which may include a plurality of primary windings in parallel and a single secondary winding. Each power amplifier may have at least one output port that is connected to the output matching network to be combined to generate a system output.

According to an example embodiment of the invention, there may be a driver amplifier which delivers one or more input signals to a plurality of power amplifiers. An interstage matching network may be provided between the driver amplifier and the plurality of power amplifiers. Likewise, an input matching network may be provided at an input to the driver amplifier. The input and inter-stage matching networks can be used to maximize a signal gain at desired operating frequency and minimize return losses.

According to an example embodiment of the invention, there may be a power coupler and a power detector connected at the output port of the power amplifier system. The power coupler can samples the output power and the power detector determines levels of output power delivered by the power coupler. The power detector sends acquired information about the output power levels to a baseband modem chip/system that generates digital control signal based on the information provide by the power detector.

According to an example embodiment of the invention, there may be a mode controller that acquires multiple-bits digital control signal from the baseband modem system. The mode controller determines a required or desired operation mode of the power amplifier system via a bias controller and/or a switch controller.

According to an example embodiment of the invention, each unit power amplifier and driver amplifier may be divided into a plurality of sub-cells, where their functions are controlled by the bias/switch controllers. When required output power level varies according to transmission environment, the power coupler with the power detector at the output of the system delivers information about the power levels to the baseband modem chip/system. The multiple-bits digital control signals may be generated in the modem chip/system and provided to the mode controller, which selects the operation mode of the power amplifier system. Then, the mode controller can control the bias controller and/or the switch controller to activate or deactivate part of sub-driver-device cells and sub-power-device cells. During operation in a varying output power environment, all parallel amplifying paths still remain activated to transfer the RF signal because at least one sub-power-device cell in each power stage (power amplifying path) is in active mode, thereby fully participating or contributing to the power combining at the output transformer. Only respective part of sub-cells in each amplifying paths are simultaneously turned-off at power back-offs. By not having inactive or idle power amplifiers/power amplifying paths at the input ports of output transformer, which provides concurrent power combining, the maximum available power efficiency of the transformer can be acquired without any penalty in the performance of entire power amplifier system.

According to an example embodiment of the invention, there may be various combinations of sub-driver-device cells and sub-power-device cells, which enables continuous enhancement in efficiency at low power levels. Driving and power capability of the driver amplifier and the power amplifiers may be pre-determined by look-up table data in the mode controller, and the controller may find out the optimal device size combinations between the driver amplifier and the power amplifiers. The mode controller can operate the bias controller so that it may generate different gate bias voltages to the driver and the power amplifiers to acquire the best efficiency performance in situations of varying sub-driver-device cell and sub-power-device cell combinations. The switch controller can turn on or off sub-driver-device cells and sub-power-device cells selected by the mode controller.

BRIEF DESCRIPTION OF THE DRAWINGS

Figure 1:
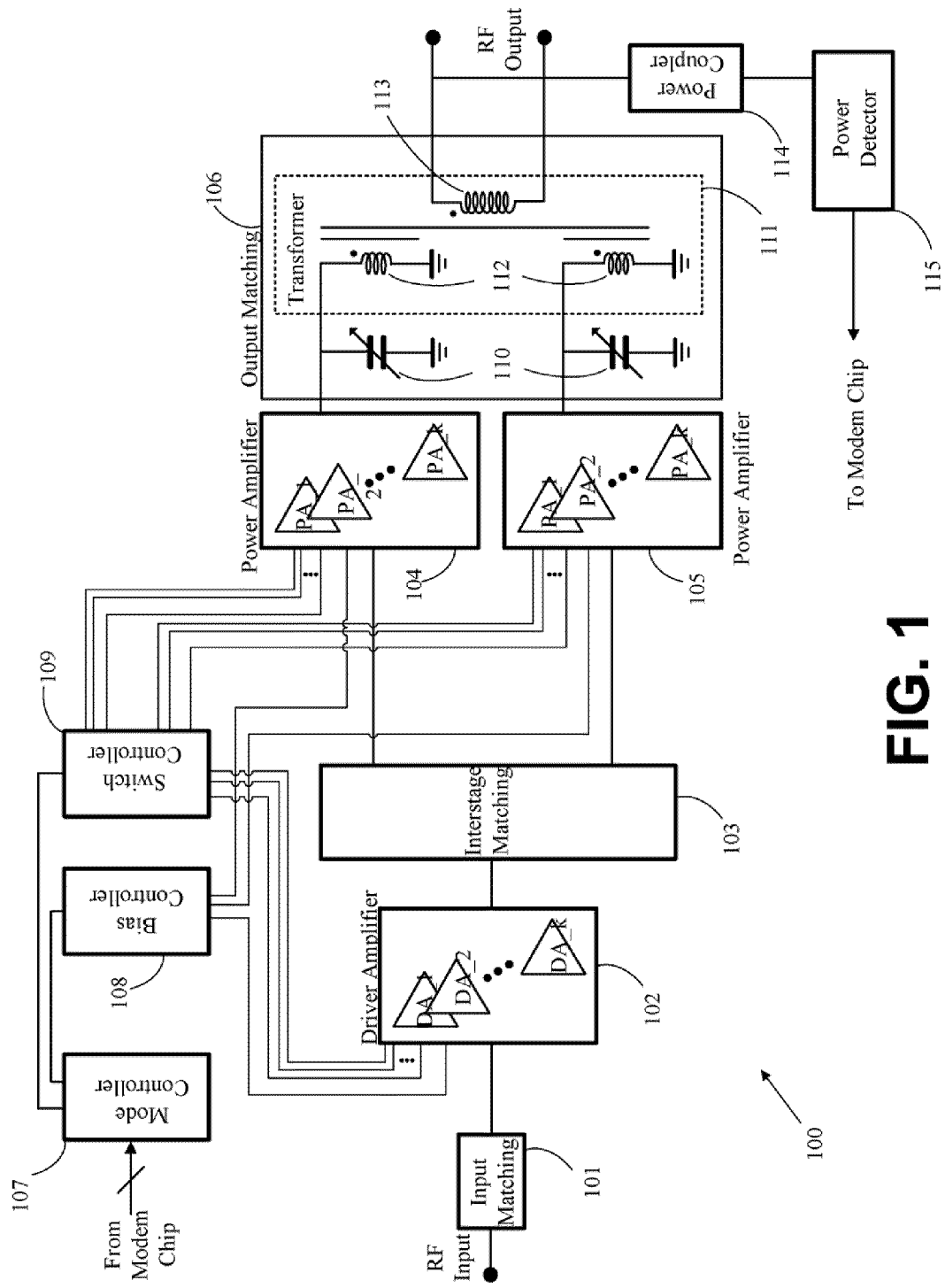

Having thus described the invention in general terms, reference will now be made to the accompanying drawings, which are not necessarily drawn to scale, and wherein:

FIG. 1 illustrates an example block diagram of a power amplifier system, according to an example embodiment of the invention.

Figure 2:
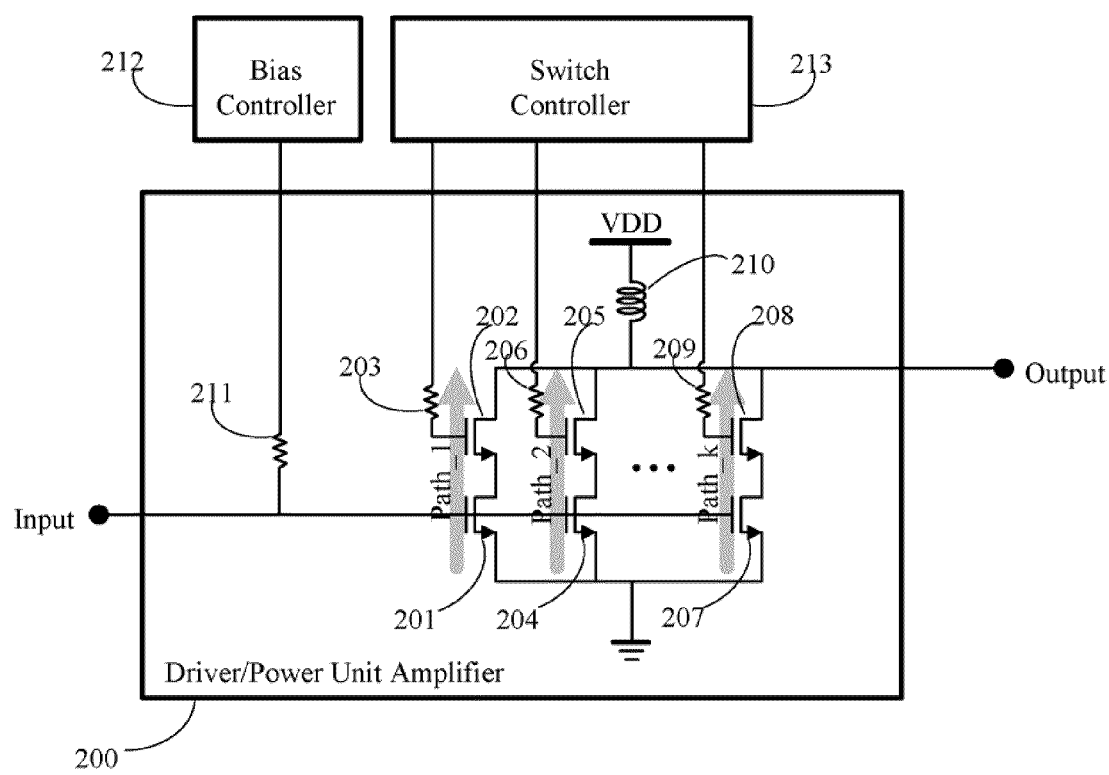

FIG. 2 illustrates an example circuit diagram of a driver amplifier and unit power amplifier describing the circuit has multiple amplifying paths which have cascode structure, according to an example embodiment of the invention.

Figure 3A:
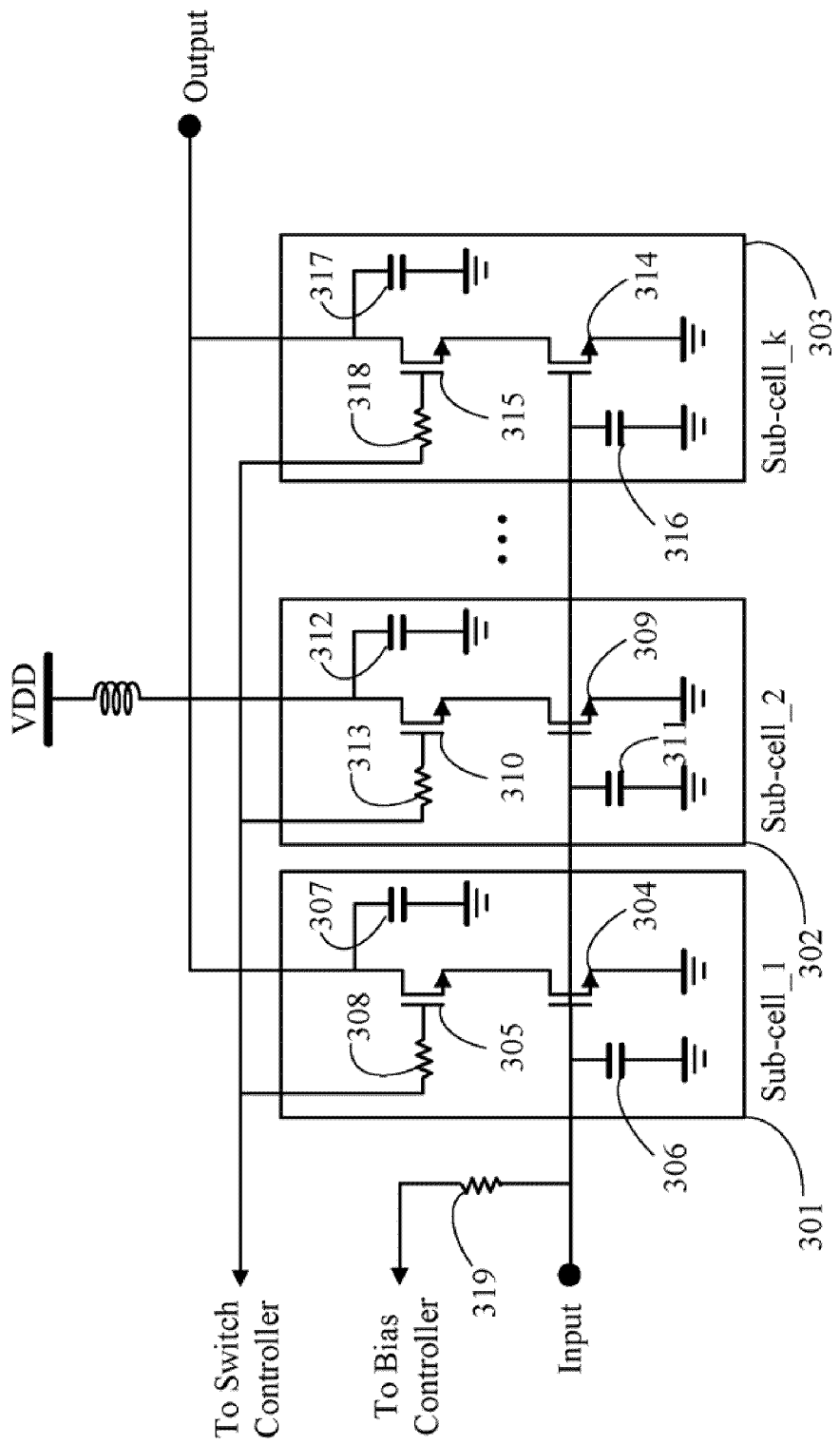

FIG. 3A illustrates an example circuit diagram of a driver amplifier and unit power amplifier including effective total input and output capacitances, according to an example embodiment of the invention.

Figure 3B:
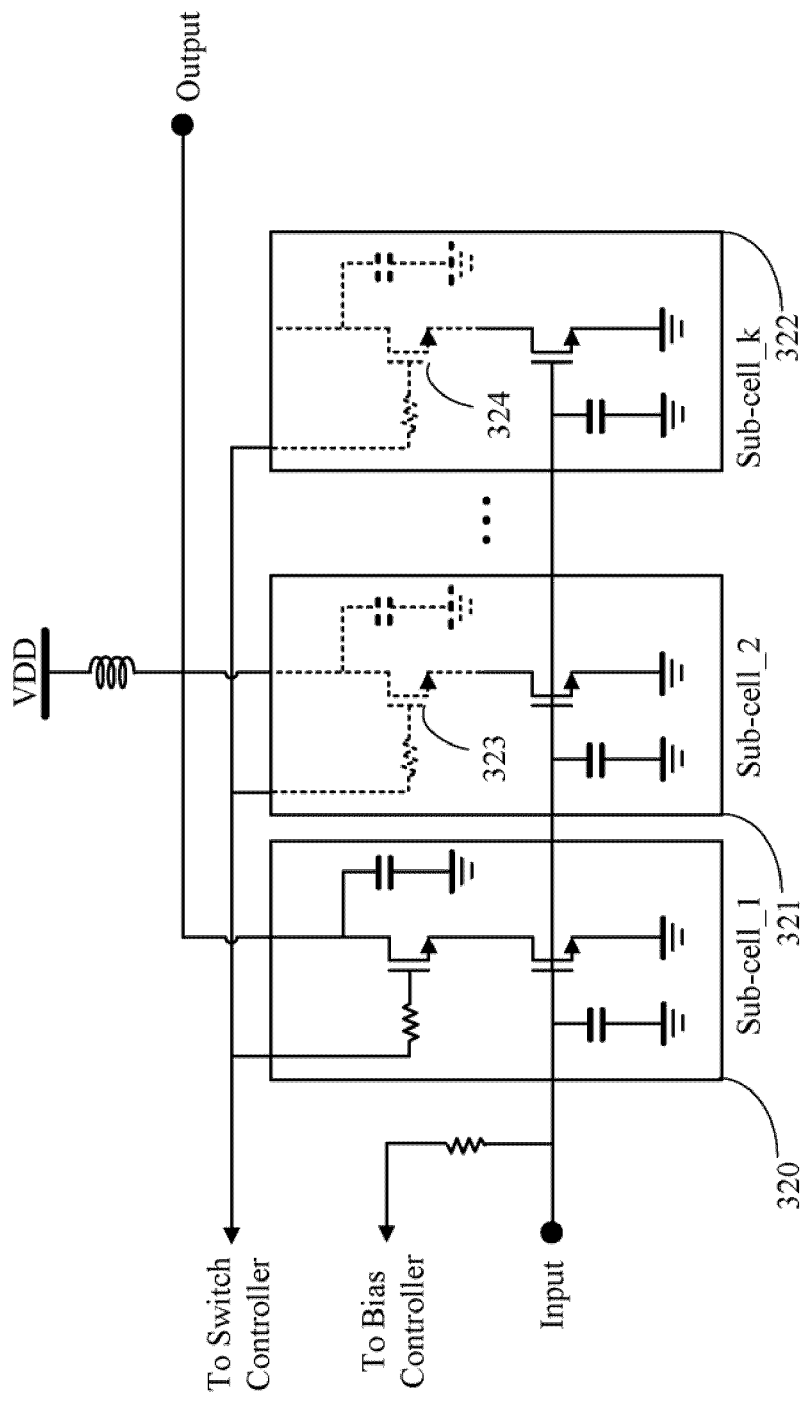

FIG. 3B illustrates an example circuit diagram of a driver amplifier and unit power amplifier including effective total input and output capacitances, where dotted lines are used to represent devices that are not participating in the signal amplification, according to an example embodiment of the invention.

Figure 4:
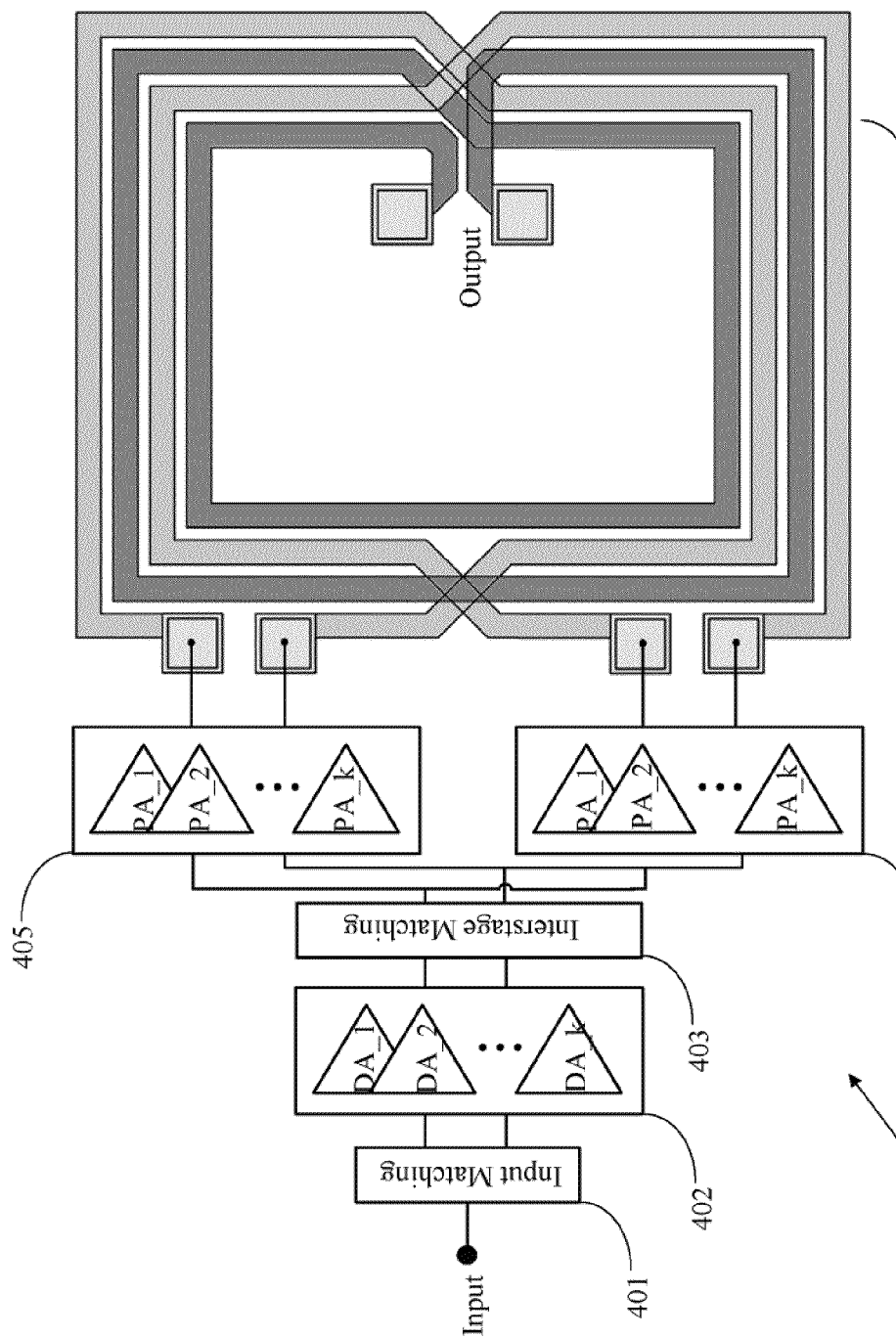

FIG. 4 illustrates an example block diagram of concurrent combining power amplifier system using a transformer with two primary windings and one secondary winding, according to an example embodiment of the invention.

Figure 5A:
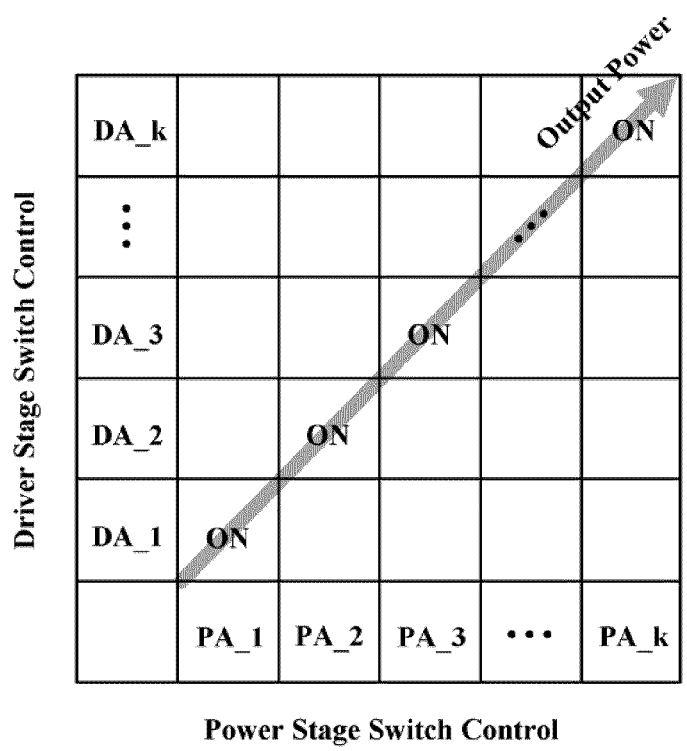

FIG. 5A illustrates an example graph of discrete switch control of sub-driver-device cells and sub-power-device cells in each amplifying path as the output power increases in accordance with an example embodiment of the invention.

Figure 5B:
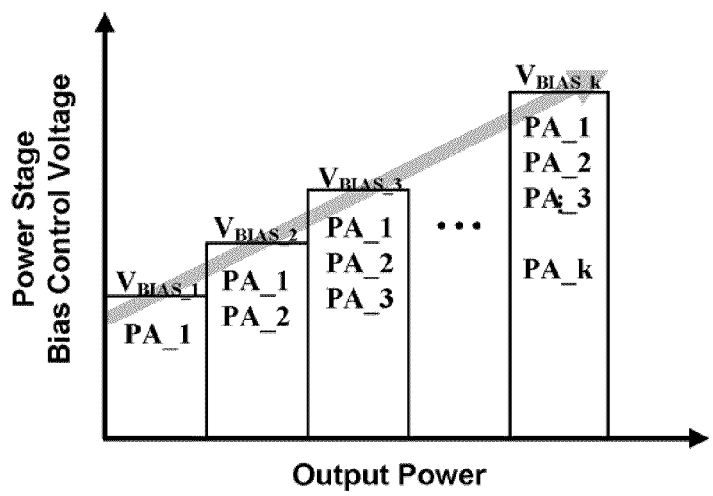

FIG. 5B illustrates a graph of discrete bias control voltage versus output power in accordance with an example embodiment of the invention.

Figure 6:
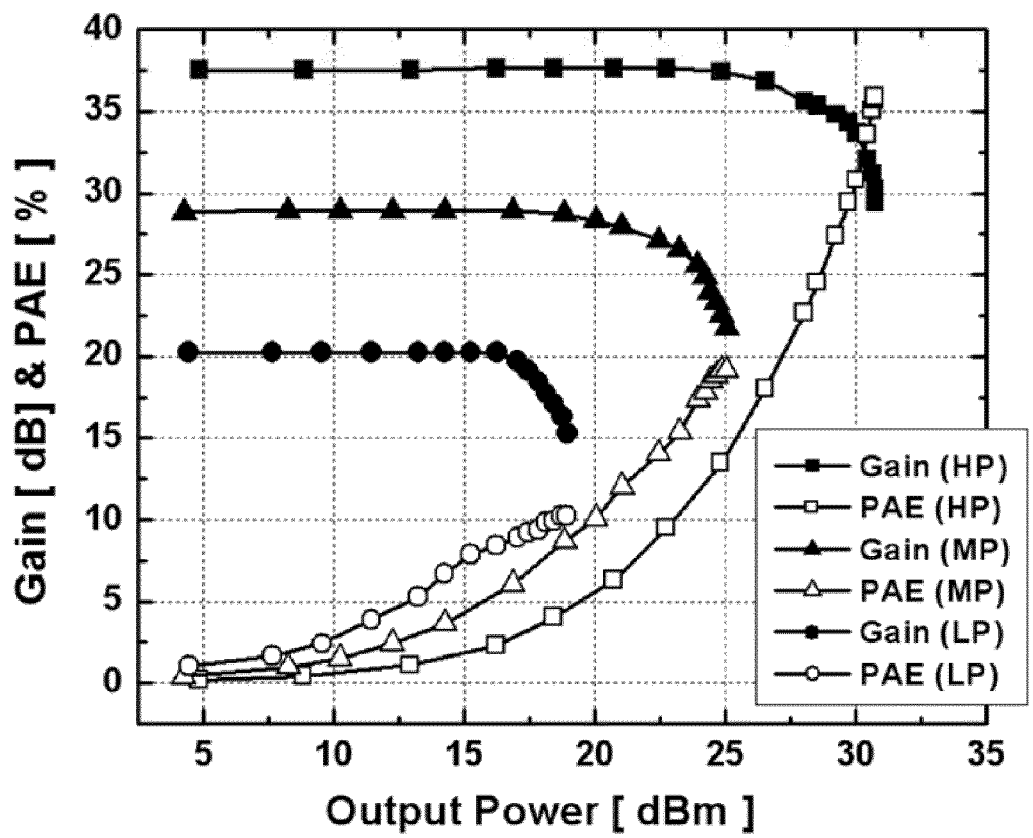
Figure 7:
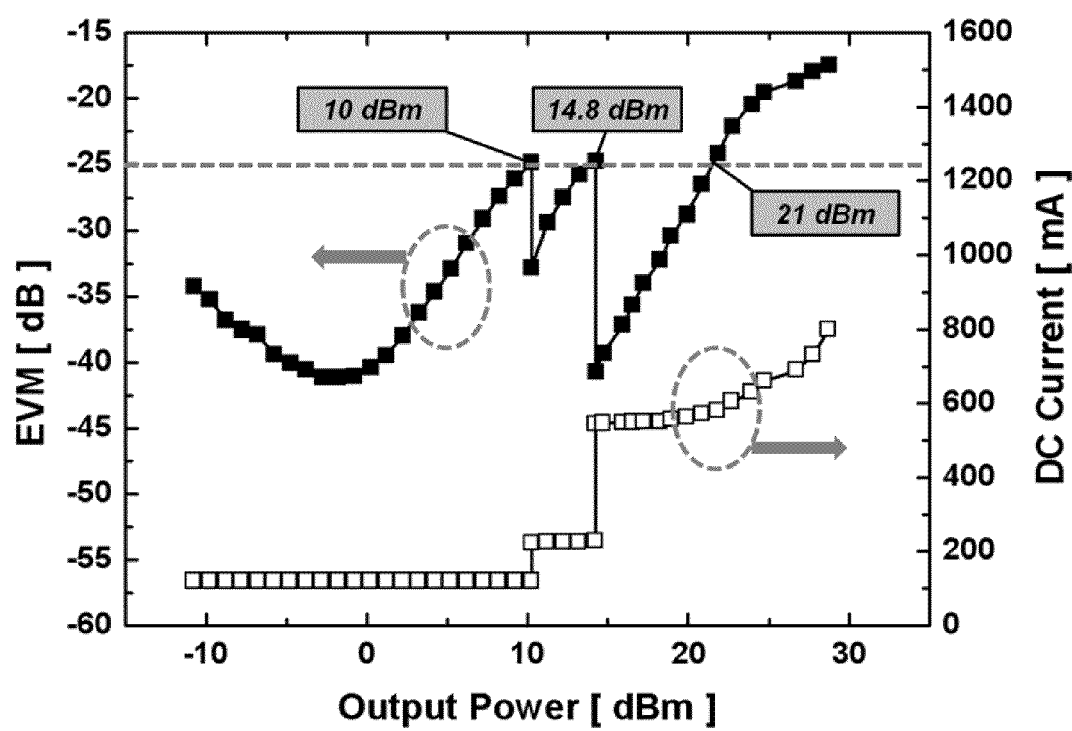

FIG. 6 illustrates example measured results for the discrete power control of an example concurrent combining power amplifier system utilizing bias control and switch control in accordance with an example embodiment of the invention FIG. 7 illustrates example measure results for the discrete power control of an example concurrent combining power amplifier system utilizing bias control and switch control in an application of IEEE 802.11g protocol in accordance with an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may be directed to power amplifiers with discrete power control and concurrent power combining. In an example embodiment of the invention, each of individual power amplifiers and a driver amplifier may be comprised of multiple unit sub-device cells to support active device resizing. Indeed, instead of turning off whole power amplifier branches for discrete power control, only some part or portion of sub-power-device cells in all power amplifier branches may be turned off to save or minimize DC power dissipation or consumption. Concurrent power combining in parallel power amplifier paths may be achieved at the multi-primary transformer without having inactive power amplifier branches. The power amplifiers and their methods may prevent unnecessary energy waste in the discrete power controlled power amplifiers systems, according to an example embodiment of the invention.

FIG. 1 illustrates an example block diagram of a power amplifier system 100 in accordance with an example embodiment of the invention. The power amplifier system 100 may include an input matching network 101, a driver amplifier 102, an interstage matching network 103, unit power amplifiers 104 and 105, an output matching network 106, a mode controller 107, bias controller 108, a switch controller 109. a power coupler 114, and a power detector 115. The driver amplifier 102 may include multiple sub-driver-device cells (DA_1 to DA_k) that can be individually and/or respectively controlled (e.g., switched ON or OFF) by the switch controller 109. Similarly, unit power amplifiers 104 and 105 may also include respective multiple sub-power-device cells (PA_1 to PA_k) that can be individually and/or respectively controlled (e.g., switched ON or OFF) by switch controller 109. In the output matching network 106, a variable capacitor block 110 may perform tuning for optimal matching points at different power modes with different power-device cell sizes, according to an example embodiment of the invention. The output transformer 111 may have two or more primary windings 112 that receive respective outputs of the respective two or more power amplifiers 104, 105. The two or more primary windings 112 may be inductively coupled with a secondary winding 113. At least one of the two output ports at the secondary winding 113 may connect to or provide the system output of the entire system, which may be sampled by the power coupler 114. The power coupler 114 may be serially connected to a power detector 115. The power detector 115 may provide information regarding the output power levels to a baseband modem chip/system, which generates a digital control signal based on the information given by the power detector. As will be described in further detail herein, the digital control signal from the baseband modem chip/system can be provided to a mode controller 107, which operates a bias controller 108 and/or switch controller 109 in accordance with a required or desired mode of operation of the power amplifier system.

With continued reference to FIG. 1, a respective bias control port and/or a respective switch control port of the unit driver amplifier 102 and the unit power amplifiers 104, 105 may be respectively controlled by a bias controller 108 and a switch controller 109. As described herein, the power detector 115 may sample output power through the power coupler 114 and provide the sampled information for the output power level to the baseband modem chip/system. The baseband modem chip/system may perform digital signal processing to generate a digital control signal for delivery to the mode controller 107, which controls the bias controller 108 and the switch controller 109 in accordance with the digital control signal. When the input or detected power level is lowered due to varying transmission environment, the mode controller 107 may let the switch controller 109 select one or more parts of the sub-driver-device cells (of unit driver amplifier 102) and/or sub-power-device cells (of unit power amplifiers 104, 105) to de-activate.

For example, in the case that the maximum output power level is required, all sub-driver-device cells (DA_1 to DA_k) and sub-power-device cells (PA_1 to PA_k) may be fully activated/functioning, and two parallel power amplifier branches are provided to the respective primary windings 112 and combined at secondary winding 113 that serves as the output of transformer 111. If some reduction of output power is needed, the switch controller 109 may deactivate one or more of sub-power-device cells in each unit power amplifier 104, 105 concurrently, according to an example embodiment of the invention. Therefore, the two parallel power amplifier branches may include same or similar number of activated/functioning sub-power-device cells (PA_1 to PA_k−1) during operation. However, it will be appreciated that such symmetry in the number of activated/functioning sub-power device cells (PA_1 to PA_k−1) may not necessarily be required, according to an example embodiment of the invention.

The switch controller 109 may also deactivate one or more sub-driver-device cells in the driver amplifier 102 to further save DC supply current, which means that a combination of activated ones of sub-driver-device cells DA_1 to DA_k−1 may drive the RF signal to the power amplifiers 104 and 105. For the minimum output power level, only sub-driver-device cell DA_1 (of driver amplifier 102) and PA_1s in two parallel paths (of power amplifiers 104, 105) may be active in the power amplifier system 100, according to an example embodiment of the invention.

Because all power amplifier branches (corresponding to two or more power amplifiers 104, 105) to the output matching network 106 are always functioning while having capability of discrete cell resizing, this type of combining may be illustratively referred to as "concurrent power combining" using multi-primary parallel combining transformer, according to an example embodiment of the invention. The bias controller 108 may acquire, via the mode controller 107, information regarding the detected power level and apply increasing bias voltage to the driver amplifier 102 and each of the unit power amplifiers 104 and 105 as the input/output power level increases. With discrete cell resizing for discrete power control along with an adaptive biasing technique, the power efficiency at power back-offs can be enhanced significantly by saving DC power consumption.

In another example embodiment of the invention, there may be numerous different combinations between sub-driver-device cells and sub-power-device cells in two parallel power amplifier paths. Moreover, each sub-driver-device cell and sub-power-device cell may have different device size (gate width). For example, sub-driver-device cells of drive amplifier 102 and sub-power-device cells of power amplifiers 104, 105 may have binary weighted device sizes such as the device size ratio of 1:2:4:8: . . . $2^k$ and so forth. Therefore, various combinations between sub-driver-device cells and sub-power-device cells can be flexibly achieved, generating relatively continuous output power levels, according to an example embodiment of the invention.

FIG. 2 illustrates detailed circuit diagram of a unit amplifier 200, according to an example embodiment of the invention. The unit amplifier 200 may be an example implementation of the unit driver amplifier 102 or unit power amplifier 104, 105 of FIG. 1, according to an example embodiment of the invention. In FIG. 2, the unit amplifier 200 may include multiple parallel signal amplifying paths (e.g., path_1 to path_k) feeding or connected to the output port of the unit amplifier 200. Each signal amplifying path may correspond to respective a sub-device cell, and is implemented by respective transistors, including field effect transistors (FETs) such as N-channel metal-oxide-semiconductor FETs (MOSFETs), although other transistors such as bipolar junction transistors (BJTs) may be used in a same configuration. As shown in FIG. 2, each individual signal amplifying path corresponding to respective sub-device cell may include two transistors—a gain transistor (e.g., 201, 204, 207) and a switch transistor (e.g., 202, 205, 208)—in a stacked configuration. More specifically, the respective drain nodes of gain transistors 201, 204, 207 may be connected to the respective source nodes of switch transistors 202, 205, 208. The input (gate) nodes of all gain transistors 201, 204 207 may be tied together and connected to the signal input port. The input nodes may also be connected to the external bias controller 212 through a high-value resistor 211 that blocks RF signal leakage to the bias controller 212. The source nodes of the gain transistors 201, 204, 207 may be tied together and connected to ground.

The switch transistors 202, 205 and 208 may have respective gate nodes connected to the external switch controller 213 through high-value resistors 203, 206 and 209. The output (drain) nodes of all amplifying paths may be tied together and connected to DC supply (VDD) through a choke inductor 210. The switch controller 213 may apply the appropriate DC voltage to the gate nodes of the switch transistors 202, 205, 208 to either activate or deactivate the respective transistors, and thus, the corresponding sub-device cell, according to an example embodiment of the invention. If the switch controller 213 turns off one of switch transistors 202, 205, 208 by applying zero or minimal DC voltage to the gate node of the respective transistor, the signal amplifying path that includes the deactivated switch transistor will be disabled and stop amplifying the received RF signal. The device size of gain/switch transistors in all amplifying paths may be binary weighted. The gate widths of gain/switch transistors may be doubled as the path number increases (e.g., device size ratio of 1:2:4:8 in case that there are four signal amplifying paths), according to an example embodiment of the invention.

It will be appreciated that in FIG. 2, the activation or deactivation of the parallel sub-device cells in the respective amplifying paths can be used to increase or decrease a gain between the input port and the output port. In general, the activation of a sub-device cell may result in the respective amplifying path contributing to or increasing a gain, while a deactivation of a sub-device cell may result in a respective amplifying path not contributing to or reducing the gain, according to an example embodiment of the invention.

FIG. 3A illustrates an example circuit diagram of a driver amplifier and unit power amplifier including effective total input and output capacitances, according to an example embodiment of the invention. The unit amplifier 300 may be a detailed implementation of the unit amplifier 200 discussed with respect to FIG. 2.

As shown in FIG. 3A, all of the amplifying cascode paths may be active, according to an example embodiment of the invention. Each amplifying path provided by unit sub-device cells 301, 302, 303 may include respective total parasitic input capacitances 306, 311, 316 at the respective input (gate) nodes of gain transistors 304, 309, 314. Each unit sub-device cell 301, 302, 303 may also include total parasitic output capacitance 307, 312, 317 at the respective output (drain) nodes of switch transistors 305, 310, 315. The total input parasitic capacitance may be a composite of a gate-to-source capacitance ($C_{GS}$) and a gate-to-drain capacitance ($C_{GD}$) after Miller effect accounted for gain transistors 304, 309, 314. The total output parasitic capacitance may be a composite of a drain-to-body junction capacitance ($C_{DB}$) and a gate-to-drain capacitance ($C_{GD}$) for the switch transistors 305, 310, 315.

FIG. 3B illustrates an example circuit diagram of a driver amplifier and unit power amplifier including effective total input and output capacitances, according to an example embodiment of the invention. In FIG. 3B, some part of the amplifying cascode paths are disabled for reduction of output power, according to an example embodiment of the invention. Indeed, in FIG. 3B, only one unit sub-device cell 320 (unit amplifying path) is activated while other sub-device cells 321, 322 are disabled by an external switch controller (e.g., switch controller 109).

The switch transistors 323, 324 in disabled amplifying paths are turned-off by zero or minimal DC voltages applied to the gates by the switch controller and are denoted by dashed lines. The amplifying paths that include disabled switch transistors 323, 324 cannot function, and only one unit sub-device cell 320 (i.e., sub-cell_1) is contributing to the signal amplification provided in the output. However, because the gain transistors are tied at the gates each other, they are always in saturation region as long as adequate gate bias voltages are supported by an external bias controller. Therefore, effective input impedance including resistive component and reactive component mainly determined by total input capacitance may remain constant as the number of active amplifying paths varies. On the other hand, the effective output impedance may vary as the number of active amplifying paths varies because total parasitic capacitance at the drain nodes of the switch transistors 305, 310, 315 may vary when they switch their operational mode between linear and saturation region. Therefore, to compensate for varying output impedance, the power amplifier system as shown in FIG. 1 may utilize variable capacitive components such as variable capacitor blocks 110 in the output matching network 106.

FIG. 4 illustrates an example of a power amplifier system 400 in accordance with an embodiment of the invention. In FIG. 4, each of the power amplifiers 404, 405 in respective combining paths have multiple sub-power-device cells. The driver amplifier 403 may also includes multiple sub-driver-device cells. The power amplifier system 400 may also include an input matching network 401, an interstage matching network 403, and combining transformer 406 at the output. The combining transformer 406 may include two primary windings coupled to respective outputs from the power amplifiers 404, 405. The two primary windings may be inductively coupled to a secondary winding of the transformer 406.

According to an example embodiment of the invention, the driver amplifier 402 and the power amplifiers 404, 405 may be implemented in differential structure each having two respective input ports and two respective output ports. The sub-divided driver amplifier 402 and power amplifiers 404, 405 can be discretely controlled for some of sub-cells to be activated/deactivated for generating varying output power levels. In an example embodiment of the invention, this structure does not have any inactive combining path (or amplifying path) at the power back-off region. Therefore, maximum power efficiency of the output transformer can be utilized while implementing discrete cell resizing and power control.

FIG. 5A illustrates an output of the switch controller (e.g., switch controller 109), which represents possible example combinations between sub-driver-device cells and sub-power-device cells as output power level increases. As the arrow indicates in FIG. 5A, sub-driver-device cell DA_1 and sub-power-device cells PA_1s are active at the minimum output power level, and other sub-driver-device cells and sub-power-device cells will be sequentially enabled as the output power level increases. For the maximum output power generation, all sub-driver-device cells and all sub-power-device cells are contributing to the power transfer. It will be appreciated that the switch controller may utilize a look-up table to determine which combinations of sub-driver-device cells and sub-power-device cells to activate, responsive to a detected input power level, to obtain a desired output power, according to an example embodiment of the invention.

FIG. 5B illustrates an output of the bias controller (e.g., bias controller 108). The gain transistors of driver amplifier and unit power amplifiers may be initially biased at class-AB close to class-B (which is known to use small bias current and have high efficiency but with low linearity). As the output power increases, the output of the bias controller increases and the class of the driver and power amplifier is shifted to class-AB close to class-A (which is known to use large bias current and have low efficiency but with high linearity). In an example embodiment of the invention, there are three sub-driver-device cells and three sub-power-device cells in unit driver and power amplifiers. When only sub-driver-device cell DA_1 and sub-power-device cells PA_1s are activated, the bias voltage is at $V_{BIAS\_1}$ (e.g., 0.55 V). When sub-driver-device cells DA_1, DA_2 with sub-power-device cells PA_1s, PA_2s are activated, the bias voltage is at higher voltage of $V_{BIAS\_2}$ (e.g., 0.6 V). When sub-driver-device cells DA_1, DA_2, DA_3 with sub-power-device cells PA_1s, PA_2s and PA_3s are activated, the bias voltage is at a yet higher voltage of V $V_{BIAS\_3}$ (e.g., 0.65 V). It will be appreciated that the example voltage values have been described herein for illustrative purposes only. Indeed, other values may be utilized without departing from example embodiments of the invention.

FIG. 6 illustrates a graph of measured results for the discrete power control of an example power amplifier system utilizing concurrent power combining with bias control in accordance with an example embodiment of the invention. The graph includes measured efficiency and gain versus output power of the power amplifier system. High power (HP) mode represents the case that all sub-driver-device cells and sub-power-device cells in two parallel combining paths are activated. Medium power (MP) mode represents the case that only two sub-driver-device cells and two sub-power-device cells in each parallel combining path are activated. Low power (LP) mode represents the case that only one (smallest) sub-driver-device cell and one sub-power-device cell in each combining path are activated. As shown in FIG. 6, power back-offs of 6 dB and 12 dB were achieved by discrete power control. The efficiency increases as the number of unit sub-cells in the driver and power amplifiers gets smaller, which is effectively implementing discrete power control. In accordance with the concurrent power combining technique as an embodiment of this invention, the efficiency at low power regions were significantly improved compared to a conventional structure.

FIG. 7 illustrates measured results for the discrete power control with concurrent power combining utilizing bias control in an application of IEEE 802.11g protocol in accordance with an example embodiment of the invention. To evaluate the linearity performance of the power amplifier system, WLAN (wireless local area network)802.11g 54-Mbps 64-QAM (quadrature amplitude modulation) OFDM (orthogonal frequency division multiplexing) (EVM limit<−25 dB) signals are applied. The EVM and DC current results are presented in FIG. 7.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A power amplifier system, comprising:
a driver amplifier having at least one first input port and at least one first output port, wherein the driver amplifier includes a plurality of sub-driver-device cells that can be individually activated or deactivated to either increase or decrease a first gain between the at least one first input port and the at least one first output port;

a plurality of unit power amplifiers configured in parallel to provide a respective plurality of power amplification branches, each unit power amplifier having at least one second input port and at least one second output port, wherein each unit power amplifier includes a plurality of sub-power-device cells that can be individually activated or deactivated to either increase or reduce a respective second gain between the respective at least one second input port and the at least one second output port;

a plurality of primary windings, wherein each primary winding is connected to a respective one of the plurality of power amplification branches via a respective at least one second output port;

a secondary winding inductively coupled to the plurality of primary windings, wherein the secondary winding provides an overall output, wherein all of the power amplification branches remain active during operation to generate the overall output; and a switch controller, wherein the switch controller operates to activate or deactivate at least one of the plurality of sub-driver-device cells in the driver amplifier and at least one of the plurality of sub-power-device cells in each of the plurality of unit power amplifiers.

2. The power amplifier system of claim 1, wherein each of the sub-driver-device cells comprise at least:

a gain transistor having a first gate, a first source, and a first drain; and a switch transistor having a second gate, a second source, and a second drain, where the gain transistor and the switch transistor are stacked such that the first drain is connected to the first source;

wherein the respective first gates of the plurality of sub-driver-device cells are connected together and further connected to the respective at least one first input port, and wherein the respective second drains of the plurality of sub-driver-device cells are connected to the respective at least one first output port.

3. The power amplifier system of claim 1, wherein each of the sub-power-device cells comprise at least:

a gain transistor having a first gate, a first source, and a first drain; and a switch transistor having a second gate, a second source and a second drain, where the gain transistor and the switch transistor are stacked such that the first drain is connected to the first source;

wherein the respective first gates of the plurality of sub-power-device cells are connected together and further connected to the respective at least one second input port, and wherein the respective second drains of the plurality of sub-power-device cells are connected to the respective at least one second output port.

4. The power amplifier system of claim 3, wherein a bias voltage is provided by a bias controller to each sub-power-device cell via the respective first gates.

5. The power amplifier system of claim 3, wherein the respective second gate of the respective switch transistor receives an activate or deactivate control signal from the switch controller via at least one respective first switch control port.

6. The power amplifier system of claim 1, wherein the driver amplifier and each unit power amplifier includes at least one respective bias control port, and further comprising:

a bias controller, wherein the bias controller provides a respective bias voltage based at least in part on a level of output power to one or more of the driver amplifier or the plurality of unit power amplifiers via the at least one respective bias control port.

7. The power amplifier system of claim 1, wherein one or both of the bias controller or the switch controller are operated by a mode controller in accordance with one of a plurality of operational modes, the mode controller selecting one of the plurality of operational modes based upon a control signal received from a modem chip or system, the control signal responsive to a detected power level of the overall output.

8. The power amplifier system of claim 1, wherein a same number of sub-power-device cells in the plurality of power amplifiers are activated or deactivated by the switch controller for discrete power control.

9. The power amplifier system of claim 1, wherein during a first operational mode, the switch controller activates one of the plurality of sub-power-device cells while deactivating remaining sub-power-devices of the plurality of sub-power-device cells in each of the plurality of unit power amplifiers, and activates one of the plurality of sub-driver-device cells of the driver amplifier; and wherein during a second operational mode, the switch controller activates at least two of the plurality of sub-power device cells while deactivating remaining sub-power-devices of the plurality of sub-power-device cells in each of the plurality of unit power amplifiers, and activates at least two of the plurality of sub-drive-device cells of the driver amplifier.

10. The power amplifier system of claim 9, wherein during the first operational mode, the activated one of the sub-power-device cells is biased at a first constant voltage level, and the activated one of the sub-driver-device cells is biased at a second constant voltage level; and wherein during the second operational mode, the activated ones of the sub-power-device cells are biased at a third constant voltage level different than the first constant voltage level, and the activated ones of the sub-driver-device cells are biased at a fourth constant voltage level different than the second constant voltage level.

11. The power amplifier system of claim 9, wherein during the first operational mode, a smallest sub-power-device cell is the activated one of the plurality of sub-power-device cells, and a smallest sub-driver-device cell is the activated one of the plurality of sub-drive-device cells; and wherein during the second operational mode, at least two smallest sub-power-device cells are the activated ones of the plurality of sub-power-device cells, and at least two smallest sub-driver-device cells are the activated ones of the plurality of sub-drive-device cells.

12. A power amplifier system, comprising:

a plurality of unit power amplifiers arranged in parallel, wherein each unit power amplifier includes at least one first input port, at least one first output port, and a plurality of sub-power-device cells configured in parallel between the at least one first input port and the at least one first output port, wherein each unit power amplifier includes at least one respective first switch control port;

a switch controller, wherein the switch controller is operative to activate or deactivate at least one of the plurality of sub-power-device cells of a respective unit power amplifier via the at least one respective first switch control port;

a driver amplifier that includes at least one second input port, at least one second output port, and a plurality of sub-driver-device cells configured in parallel between the at least one second input port and the at least one second output port, wherein at least one second output from the at least one second output port of the driver amplifier is provided to the plurality of unit power amplifiers via the at least one first input port, and wherein the switch controller is operative to activate or deactivate at least one of the plurality of sub-driver-device cells of a respective driver amplifier via at least one respective second switch control port; and an output matching network, wherein the output matching network is configured to combine respective outputs from the at least one first output port of the respective plurality of unit power amplifiers to generate a system output, wherein during an operational state, all of the plurality of unit power amplifiers contribute outputs to the output matching network to enable to the output matching network to generate the system output.

13. The power amplifier system of claim 12, wherein responsive to a detected power level, the switch controller is operative to concurrently activate or deactivate an equal number of the plurality of sub-power-device cells in at least two of the plurality of unit power amplifiers.

14. The power amplifier system of claim 12, wherein each unit power amplifier further includes at least one respective first bias port, and further comprising:

a bias controller, wherein the bias controller provides a respective bias voltage based at least in part on a detected power level to each unit power amplifier via the at least one respective first bias port.

15. The power amplifier system of claim 14, wherein one or both of the bias controller or the switch controller are operated by a mode controller in accordance with one of a plurality of operational modes, the mode controller selecting one of the plurality of operational modes based upon a control signal received from a modem chip or system, the control signal responsive to a detected power level of the system output.

16. The power amplifier system of claim 12, each of the plurality of sub-power-device cells comprises:

a gain transistor having a first gate, a first source, and a first drain; and a switch transistor having a second gate, a second source, and a second drain, where the gain transistor and the switch transistor are stacked such that the first drain is connected to the first source;

wherein the respective first gates of the plurality of sub-power-device cells are connected together and further connected to the respective at least one first input port, and wherein the respective second drains of the plurality of sub-power-device cells are connected to the respective at least one first output port.

17. The power amplification system of claim 16, wherein a bias voltage is provided by a bias controller to each sub-power-device cell via the respective first gate, wherein the respective second gate of the respective switch transistor receives a control signal to activate or deactivate from the switch controller from the at least one respective first switch control port.

18. The power amplifier system of claim 12, wherein the output matching network includes a variable capacitive element in order to adjust a capacitance based upon a respective number of sub-power-device cells that have been activated or deactivated in a respective unit power amplifier.

19. The power amplifier system of claim 12, wherein the output matching network comprises a plurality of primary windings coupled to a secondary winding, wherein each of the plurality of primary windings is coupled to a respective one of the plurality of unit power amplifiers via the at least one first output port, wherein at least one port of the secondary winding is used to generate the system output.

* * * * *